United States Patent [19]
Taylor, Jr. et al.

[11] Patent Number: 5,965,321
[45] Date of Patent: *Oct. 12, 1999

[54] PEEL-APART PHOTOSENSITIVE ELEMENTS AND THEIR PROCESS OF USE

[75] Inventors: Harvey Walter Taylor, Jr., Sayre; Gregory Charles Weed, Towanda, both of Pa.

[73] Assignee: E. U. du Pont de Nemours and Company, Wilmington, Del.

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/937,825

[22] Filed: Sep. 25, 1997

[51] Int. Cl.$^6$ ............................. G03C 1/805; G03C 11/12
[52] U.S. Cl. ......................... 430/258; 430/260; 430/262; 430/263
[58] Field of Search .................... 430/258, 260, 430/262, 263

[56] References Cited

U.S. PATENT DOCUMENTS

| | | | |
|---|---|---|---|
| 3,469,982 | 9/1969 | Celeste | 430/278.1 |
| 3,649,268 | 3/1972 | Chu et al. | 96/27 R |
| 3,984,244 | 10/1976 | Collier et al. | 427/359 |
| 4,053,313 | 10/1977 | Fan | 96/36 |
| 4,174,216 | 11/1979 | Cohen et al. | 430/257 |
| 4,258,247 | 3/1981 | Shimada et al. | 219/137 |
| 4,282,308 | 8/1981 | Cohen et al. | 430/271 |
| 4,316,951 | 2/1982 | Cohen et al. | 430/253 |
| 4,489,153 | 12/1984 | Ashcraft et al. | 430/253 |
| 4,719,169 | 1/1988 | Platzer et al. | 430/258 |
| 4,902,504 | 2/1990 | Wilson et al. | 424/84 |
| 4,921,776 | 5/1990 | Taylor, Jr. | 430/293 |
| 4,999,266 | 3/1991 | Platzer et al. | 430/14 |
| 5,001,036 | 3/1991 | Choi | 430/271 |
| 5,019,536 | 5/1991 | Taylor, Jr. | 428/220 |
| 5,028,511 | 7/1991 | Choi | 430/293 |
| 5,071,731 | 12/1991 | Chen et al. | 430/271 |
| 5,087,549 | 2/1992 | Peiffer | 430/253 |
| 5,234,790 | 8/1993 | Lang et al. | 430/253 |
| 5,437,959 | 8/1995 | Hou | 430/256 |
| 5,609,984 | 3/1997 | Hou | 430/256 |
| 5,667,935 | 9/1997 | Hou | 430/256 |
| B1 4,053,313 | 11/1987 | Fan | 430/270 |

FOREIGN PATENT DOCUMENTS

| | | |
|---|---|---|
| 0 260 873 | 3/1988 | European Pat. Off. . |
| 0 386 355 | 3/1991 | European Pat. Off. . |
| 0 664 485 A2 | 7/1995 | European Pat. Off. . |
| 1366769 | 3/1972 | United Kingdom . |
| WO 92/15920 | 9/1972 | WIPO . |

OTHER PUBLICATIONS

U.S. Patent Appln. Serial No: 08/936,905 filed Sep. 25, 1997.

Bruno, Michael H., *Principles of Color Proofing*, GAMA Communications, Salem, N.H., 1986.

*Primary Examiner*—John S. Chu
*Assistant Examiner*—Yvette M. Clarke

[57] ABSTRACT

An element containing, in order: a first strippable substrate; a substantially transparent, non-photosensitive, polymeric isolation layer having a coating weight of 10 to 150 mg/dm$^2$; an essentially non-photosensitive, non-tacky organic layer having a coating weight of 25 to 200 mg/dm$^2$; a pigmented photosensitive, preferably photopolymerizable layer; and a second different strippable substrate adjacent the photosensitive layer, wherein the photosensitive layer upon imagewise exposure to actinic radiation exhibits a lowered peel force relative to a system which does not have a polymeric isolation layer.

12 Claims, No Drawings

PEEL-APART PHOTOSENSITIVE ELEMENTS AND THEIR PROCESS OF USE

FIELD OF THE INVENTION

This invention relates to a photosensitive element and more particularly, this invention relates to a low peel force peel-apart, photosensitive element and its process of use.

BACKGROUND OF THE INVENTION

Photosensitive elements which can be used in image-reproduction processes are well-known in the graphics arts industry. Such elements are exposed to actinic radiation through an image-bearing transparency, such as a color separation transparency, and developed to produce an image which is either positive or negative with respect to the transparency used. Positive-working elements produce an image which is a duplicate of the transparency through which they are exposed. Negative-working elements produce an image that is the reverse of the transparency through which they are exposed. After imagewise exposure, the photosensitive elements may be developed by washout of soluble image areas, toning tacky image areas with a colorant, peeling apart photoadherent layers, or combinations of these techniques. A series of images may be combined to form a color proof. A useful reference for color proofing methods is *Principles of Color Proofing*, by Michael H. Bruno, GAMA Communications, Salem,. N.H., 1986.

In Cohen and Fan, U.S. Pat. No. 4,282,308, there is described a photosensitive element which is capable of producing reverse, colored images by a dry process without the need for toning with a colorant. The element comprises, in order from top to bottom, a strippable cover sheet, a photoadherent layer containing a colorant, a tacky essentially nonphotosensitive elastomeric layer, and a support. After imagewise exposure to actinic radiation through the cover sheet, the element can be peeled apart by peeling off the cover sheet with the exposed areas of the colored photoadherent layer adhered thereto. The unexposed areas of the colored photoadherent layer remain on the supported elastomeric layer. When the imagewise exposure is through a negative transparency, and the exposed element is peeled apart, a positive image is obtained on the peeled-off cover sheet and a negative image is obtained on the supported elastomeric layer. Imagewise exposure through a positive transparency, followed by peeling apart of the element, yields a negative image on the peeled-off cover sheet and a positive image on the supported elastomeric layer. However, these tacky, essentially nonphotosensitive, elastomeric layer-containing elements result in high peel force peel-apart systems.

A need exists for a photosensitive element comprised of layers which have a low peel force and the required adhesion balance so the element can be effectively developed using peel-apart development.

SUMMARY OF THE INVENTION

The present invention relates to a multilayer element which is useful in the production of multicolor proofs using a stacking method. Surprisingly and unexpectedly, it has been found that an essentially non-photosensitive, non-tacky organic layer adjacent an isolation layer which is ultimately adjacent to a permanent support of the proof can positively affect or influence the peel or adhesion properties of the photosensitive layer located adjacent the an essentially non-photosensitive, non-tacky organic layer. This essentially non-photosensitive, non-tacky organic layer in conjunction with the isolation layer of the photosensitive element of the invention provides the required lower peel force for forming a second, third and fourth pigmented layers for a multicolor proof. The polymeric isolation layer also provides the required adhesion to a wide variety of permanent receptors and provides for the handling of the element in sheet form. The essentially non-photosensitive, non-tacky organic layer provides the required adhesion balance between the photosensitive layer and the isolation layer located adjacent the permanent substrate during processing. Preferably, the polymeric isolation layer and essentially non-photosensitive, non-tacky organic layer are soluble in organic solvents and insoluble in aqueous or alkaline aqueous solutions.

The present invention is directed to an element comprising, in order:

(a) a first strippable substrate S1;

(b) a substantially transparent, non-photosensitive, polymeric isolation layer having a coating weight of 10 to 150 mg/dm$^2$, preferably 30 to 100 mg/dm$^2$, more preferably 45 to 60 mg/dm$^2$;

(c) an essentially non-photosensitive, non-tacky organic layer comprising a polymer selected from the group consisting of:

(i) structured, preferably block, or random polymers prepared from at least one aromatic monomer and at least one monomer selected from the group consisting of butadiene, olefins such as ethylene, propylene, etc., butylene, isobutylene, butene, isoprene, 1,4-hexadiene, acrylonitrile and vinyl acetal; and (ii) reaction products of random polymers prepared from at least one aromatic monomer and at least one monomer selected from the group consisting of an olefin such as ethylene, propylene, etc., and butylene with 2-butenedioic acid or cyclic anhydrides;

(d) a photosensitive, optionally pigmented, preferably photopolymerizable layer, and (e) a second strippable substrate S2 adjacent the photosensitive layer; wherein the photosensitive layer exhibits improved adhesion to the second strippable substrate following imagewise exposure to actinic radiation.

A photorelease layer consisting essentially of a solid oxyethylene homopolymer photorelease agent of the formula, $H(COH_2CH_2)_nOH$, with a molecular weight greater than about 3000 may be present between second strippable substrate S2 and the photosensitive layer to effect image reversal with proper separation using the photosensitive elements of the invention. These peel-apart elements result in low peel force peel-apart systems.

The invention also relates to the element as described above wherein the photosensitive layer is a photopolymerizable layer or the element as above wherein the photosensitive layer has a coating weight of 5 to 50 mg/dm$^2$.

The invention also relates to the element as above wherein the first and second strippable substrates are selected from the group consisting of silicone-treated, electrically discharged (ED), corona-treated, electron beam treated and plasma-treated films selected from the group consisting of polyester, matte finished polyester and polyethylene and polypropylene.

The first strippable substrate may be a silicone release treated polyester film. The second strippable substrate may be selected from an ED treated polyester film. The non-photosensitive, polymeric isolation layer may have a coating weight of 45 to 60 mg/dm$^2$. The non-photosensitive, polymeric isolation layer comprises a vinyl polymer, or comprises an acrylate type thermoplastic polymer.

The essentially non-photosensitive, non-tacky organic layer may have a coating weight of 70 to 90 mg/dm$^2$. The essentially non-photosensitive, non-tacky organic layer comprises at least one essentially non-photosensitive, non-tacky organic polymer.

The invention preferably relates to an element as recited above which is in sheet form.

In a second embodiment, the invention is directed to a process for forming a prepress proof comprising, (I) providing a photosensitive element comprising, in order,
- (a) a first strippable substrate S1;
- (b) a substantially transparent, non-photosensitive, polymeric isolation layer having a coating weight of 10 to 150 mg/dm$^2$, preferably 30 to 100 mg/dm$^2$, more preferably 45 to 60 mg/dm$^2$;
- (c) an essentially non-photosensitive, non-tacky organic layer having a coating weight of 25 to 200 mg/dm$^2$, preferably 60 to 150 mg/dm$^2$, more preferably 70 to 90 mg/dm$^2$, and comprising a polymer selected from the group consisting of:
  - (i) structured, preferably block, or random polymers prepared from at least one aromatic monomer and at least one monomer selected from the group consisting of butadiene, olefin such as ethylene, propylene, etc., butylene, isobutylene, butene, isoprene, 1,4-hexadiene, acrylonitrile and vinyl acetal; and
  - (ii) reaction products of random polymers prepared from at least one aromatic monomer and at least one monomer selected from the group consisting of an olefin such as ethylene, propylene, etc., and butylene with 2-butenedioic acid or cyclic anhydrides;
- (d) a photosensitive, optionally pigmented, preferably photopolymerizable, layer; and
- (e) a second strippable substrate S2 adjacent the photosensitive layer, wherein the photosensitive layer exhibits improved adhesion to the second strippable substrate upon imagewise exposure to actinic radiation;

(II) removing the first substrate S1 and laminating the polymeric isolation layer of the photosensitive element to a permanent support;

(III) imagewise exposing the photosensitive element to actinic radiation through a color separation to form imaged and non-imaged areas;

(IV) developing the exposed photosensitive element by removing, preferably peeling off, the second strippable substrate S2 to form a colored image on the permanent support wherein removal requires a peel force P2; and (V) repeating steps (I) to (IV) at least once using a different photosensitive element and a different color separation, and in step (II), laminating the different photosensitive element to the permanent support having thereon a colored image formed in step (IV); wherein the polymeric isolation layer from the different photosensitive element is adjacent the colored image formed in step (IV).

The invention also relates to the process as described above wherein the peel force is lowered by 75% or more, or the process as above wherein, in step (II), the first substrate is peeled off.

The photosensitive layer in the above process may be a photopolymerizable layer and the photosensitive layer may have a coating weight of 5 to 50 mg/dm$^2$.

The invention also relates to the processes as above wherein the first and second strippable substrates are selected from the group consisting of silicone-treated, electrically discharged (ED), corona-treated, electron beam treated and plasma-treated films selected from the group consisting of polyester, matte finished polyester, polyethylene and polypropylene and includes the process as above wherein the first strippable substrate is a silicone release treated polyester film and the process wherein the second strippable substrate is an ED treated polyester film.

The non-photosensitive, polymeric isolation layer utilized in the above processes may have a coating weight of 45 to 60 mg/dm$^2$ and may be selected from a vinyl polymer or an acrylate-type thermoplastic polymer.

The process includes essentially non-photosensitive, non-tacky organic layers having a coating weight of 70 to 90 mg/dm$^2$ and includes an essentially non-photosensitive, non-tacky organic layer selected from at least one essentially non-photosensitive, non-tacky organic polymer.

Preferably, the above processes utilize a photosensitive element in sheet form.

The invention also relates to a process wherein a top coat element comprising a substrate and at least one non-photosensitive layer is laminated on the colored image formed in step (IV), with the polymeric isolation layer adjacent the colored image formed in step (IV) or a process wherein a top coat element comprising a substrate and two non-photosensitive layers are laminated on said colored image.

The peel force (P2) required to remove the exposed photopolymerized layer and the second substrate from the essentially non-photosensitive, non-tacky organic layer is much less than the peel force required to remove a similarly exposed element which does not have the essentially non-photosensitive, non-tacky organic layer. Applicants' invention is also directed to elements or processes as recited herein wherein a layer adjacent to the essentially non-photosensitive, non-tacky organic layer, namely the isolation layer lowers the peel force P2 needed to remove photoexposed material relative to any system which does not have such an additional layer adjacent to an essentially non-photosensitive, non-tacky organic layer which would have a peel force P1.

In a third embodiment the invention is directed to an element comprising, in order:
- (a) a permanent substrate;
- (b) a substantially transparent, non-photosensitive, polymeric isolation layer having a coating weight of 10 to 150 mg/dm$^2$;
- (c) an essentially non-photosensitive, non-tacky organic layer having a coating weight of 25 to 200 mg/dm$^2$, and comprising a polymer selected from the group consisting of:
  - (i) structured, preferably block, or random polymers prepared from at least one aromatic monomer and at least one monomer selected from the group consisting of butadiene, olefins such as ethylene, propylene, etc., butylene, isobutylene, butene, isoprene, 1,4-hexadiene, acrylonitrile and vinyl acetal; and
- (d) unexposed image areas of a pigmented photosensitive layer.

In a fourth embodiment, the invention is directed to the element disclosed above which further comprises a photorelease layer to effect image reversal with proper separation consisting essentially of a solid oxyethylene homopolymer photorelease agent of the formula, $H(COH_2CH_2)_nOH$, with a molecular weight greater than about 3000, wherein the photorelease layer is present between second strippable substrate S2 and the photosensitive layer.

The phrase "consisting essentially of" is intended in the present disclosure to have its customary meaning, namely, that the films of the invention are limited to the specified ingredients and other ingredients that do not materially affect the basic and novel characteristics of the compositions claimed. For example, while it is understood that the photorelease layer must contain a solid oxyethylene homopolymer photorelease agent of the formula, $H(COH_2CH_2)_nOH$, with a molecular weight greater than about 3000, other compatible components may also be present when needed to achieve a film having a particular set of properties. In other words, unspecified materials are not excluded so long as they do not prevent the benefits of the invention.

DETAILED DESCRIPTION OF THE INVENTION

The present invention is directed to an element comprising, in order: a first strippable substrate S1; a substantially transparent, non-photosensitive, polymeric isolation layer having a coating weight of 10 to 150 $mg/dm^2$, preferably 30 to 100 $mg/dm^2$, more preferably 45 to 60 $mg/dm^2$; an essentially non-photosensitive, non-tacky organic layer having a coating weight of 25 to 200 $mg/dm^2$, preferably 60 to 150 $mg/dm^2$, more preferably 70 to 90 $mg/dm^2$; a photosensitive, optionally pigmented, preferably photopolymerizable layer, and a second strippable substrate S2 adjacent the photosensitive layer, wherein the photosensitive layer exhibits improved adhesion to the second strippable substrate when the first strippable substrate is removed, e.g., peeled off. In other words, when the first strippable substrate is removed, there is essentially no tendency for the photosensitive layer to be pulled away from the second strippable substrate.

STRIPPABLE SUBSTRATES

First and second strippable substrates are provided adjacent the polymeric and photosensitive layers, respectively, to facilitate handling and storage. Such strippable substrates may be particularly useful if the photosensitive layer is to be stored in a roll prior to use. The first strippable substrate would be removed prior to lamination to the permanent support. The photosensitive layer exhibits improved adhesion to the second strippable substrate when the first strippable substrate is removed, e.g., peeled off. The second strippable substrate is removed, preferably peeled off, after the photosensitive element is exposed to actinic radiation. The first and second strippable substrates used in this invention are different so proper adhesion balances are maintained during the process of this invention. Some suitable materials for the first and second strippable substrates, as long as they are different, would include silicone-treated, electrically discharged (ED), corona-treated, electron beam treated or plasma-treated polyester, matte finished polyester or polyethylene, polypropylene, etc., which release readily from the layer they serve to protect. Preferably, the first strippable substrate is silicone release Mylar® polyester film and the second strippable substrate is ED treated Mylar® polyester film, available from E. I. du Pont de Nemours and Company, Wilmington, Del. (DuPont).

POLYMERIC ISOLATION LAYER

The polymeric isolation layer may have a coating weight of 10 to 100 $mg/dm^2$, preferably 30 to 80 $mg/dm^2$, more preferably 55 $mg/dm^2$. It comprises a thermoplastic polymer, preferably a vinyl-type or an acrylate-type thermoplastic polymer, and optionally UV stabilizers, antioxidants, plasticizers, coating aids, etc. The thermoplastic polymer may have a solubility in acetone or toluene of 20 grams per 100 grams of acetone or toluene at 25° C. The thermoplastic polymer may be used in combination with other compatible thermoplastic polymers to adjust the properties of the polymer to the above outlined limits. By compatible we mean the ability of a mixture of two or more polymers to remain dispersed within one another without segregation or phase separation from each other over time. Preferably, the thermoplastic polymer is used alone because this reduces the possibility of variations in coating solutions which results in variability and lack of reproducibility in the final product.

Some useful vinyl-type thermoplastic polymers include poly vinyl acetate homopolymers or copolymers, polyvinylidine chloride, polyvinyl acetate/ethylene copolymers, polyvinyl acetals such as polyvinyl butyral and polyvinyl formal, etc. Preferably, these polymers are not aqueous alkali soluble. Some useful solvent soluble polymers are sold under the tradenames Vinac® resins manufactured by Air Products Company, Wayne, N.J.; Mowilith® resins manufactured by Hoechst Celanese, Charlotte, N.C.; etc. Polyvinyl acetate is preferred.

Alternately, the polymeric isolation layer may comprise an acrylate-type thermoplastic polymer. Some useful acrylate-type thermoplastic polymers include poly(ethyl methacrylate), poly(butyl methacrylate), acrylate and methacrylate copolymers, etc. The preferred thermoplastic polymers include poly(ethyl methacrylate), poly (butylmethacrylate), and methyl methacrylate copolymer. These polymers are sold under the tradenames Elvacite® 2042 polymer, Elvacite® 2044 polymer, Elvacite® 2045 polymer, and Elvacite® 2046 polymer from E. I. du Pont de Nemours and Company, Wilmington, Del., or Carboset® polymers from B.F. Goodrich Co., Brecksville, Ohio.

As is well known to those skilled in the art, commercially available polymers of the type described herein may contain small amounts of other polymerized material. It is intended that the chemical descriptions given are interpreted to mean those polymers that are substantially made up of the monomer(s) indicated. For example, a commercial ethylmethacrylate polymer may contain a few percent of methylmethacrylate. It is contemplated that such copolymers will fall within the invention as disclosed.

The thermoplastic polymer may be used in combination with UV stabilizers, anti-oxidants, etc. Some useful UV stabilizers include benzotriazoles and benzophenones. Some useful anti-oxidants include hindered phenols such as tetrakis[methylene 3-(3,5-di-t-butyl-4-hydroxyphenyl) propionate] methane, and 1,3,5-trimethyl-2,4,6-tris(3,5-di-t-butyl-4-hydroxybenzyl)benzene.

The thermoplastic polymer may be mixed with the optional ingredients and dissolved in an appropriate solvent. One advantage of this invention is that the thermoplastic polymer is soluble in both flammable and non-flammable solvents. Preferred solvents include acetone, tetrahydrofuran and toluene because they are flammable solvents and eliminate the environmental concerns associated with the use of non-flammable solvents.

The coating weight of the polymeric isolation layer should be high enough to insure structural integrity, but low enough to avoid distortion of the image through a three-dimensional effect. In general, the coating weight of the polymeric isolation layer should be in the range of about 10 to 150 mg/dm², preferably 30 to 100 mg/dm², more preferably 45 to 60 mg/dm².

ESSENTIALLY NON-PHOTOSENSITIVE NON-TACKY ORGANIC LAYER

The essentially non-photosensitive, non-tacky organic layer comprises a polymer selected from the group consisting of:

(a) structured, preferably block or random polymers prepared from at least one aromatic monomer such as styrene, substituted styrenes such as α-methyl styrene, p-hydroxy styrene, etc. and at least monomer selected from the group consisting of butadiene, olefin such as ethylene, propylene, etc., butylene, isobutylene, butene, isoprene, 1,4-hexadiene, acrylonitrile and vinyl acetal. Some useful structured, preferably block and random polymers include styrene//ethylene/butylene//styrene block copolymers, styrene//ethylene/propylene block copolymers, hydrogenated butadiene polymers with styrene, isoprene polymers with styrene, styrene//butadiene//ethylene block copolymers, ethylene-1,4-hexadiene/propylene rubber that has grafted to it isobutylene and styrene or isobutylene and α-methyl styrene, styrene/ethylene/isobutylene random copolymers, polystyrene graft copolymers such as styrene//acrylonitrile, styrene//isobutylene, styrene//ethylene or styrene//propylene, polyolefin polymers with styrene grafted thereon, and acrylonitrile/ethylene/isobutene/styrene/vinyl acetate, acrylonitrile/ethylene/propylene/styrene/vinyl acetate, acrylonitrile/1-butene/ethylene/propylene/vinyl acetate, acrylonitrile/ethylene/isobutene/styrene and acrylonitrile/ethylene/olefin/styrene. Triblocks are derived from the diblocks using a linking agent. In the polymers disclosed above "//" represent blocks and random is represented by a "/".

(b) reaction products of random polymers prepared from at least one aromatic monomer and at least one monomer selected from the group consisting of an olefin such as ethylene, propylene, etc., with 2-butenedioic acid or cyclic anhydrides. Some examples include styrene/ethylene/butylene random copolymers and reaction products thereof with 1-butenedioic acid or cyclic anhydrides such as succinic anhydride or maleic anhydride.

By "non-tacky" we mean that the layer is substantially non-tacky at room temperature.

As is readily apparent to those skilled in the art, the essentially non-photosensitive, non-tacky organic layer may also contain such ingredients as tackifiers, anti-oxidants, etc. Any suitable solvent may be used to coat the essentially non-photosensitive, non-tacky organic layer provided it is compatible with the solvent used in the polymeric isolation layer. The coating weight of the essentially non-photosensitive, non-tacky organic layer may be varied over a wide range and is primarily determined by the other physical property requirements of the system. That is, the minimum coating weight is that which will provide a film with sufficient coating weight to laminate evenly over the imaged surface. The maximum coating weight is that which will provide a film which will not distort the image, i.e., give a three-dimensional appearance. In general, the essentially non-photosensitive, non-tacky organic layer should have a coating weight in the range of 25–200 mg/dm², preferably 60 to 150 mg/dm², more preferably 70 to 95 mg/dm².

PHOTOSENSITIVE LAYER

The photosensitive layer, which is optionally pigmented, is one in which the adhesive relationship vis-a-vis the second strippable substrate and essentially non-photosensitive, non-tacky organic layer is altered by exposure to actinic radiation. Before exposure to actinic radiation, the photosensitive layer adheres more strongly to the essentially non-photosensitive, non-tacky organic layer than to the second strippable substrate. If the unexposed element were peeled apart by peeling off the second strippable substrate, the photosensitive layer would remain on the essentially non-photosensitive, non-tacky organic layer. However, the exposed areas of the photosensitive layer adhere more strongly to the second strippable substrate than to the essentially non-photosensitive, non-tacky organic layer and would be removed with the second strippable substrate if it were peeled off.

The pigmented photosensitive layer is preferably photopolymerizable, comprising an ethylenically unsaturated photopolymerizable monomer, a polymeric binder and an initiator of initiator system which initiates free radical addition polymerization on exposure to actinic radiation. The colorant may be a water insoluble colorant such as a pigment or a disperse, or a water soluble dye.

Some suitable monomers, binders, initiators or initiating systems and colorants are disclosed in Assignee's U.S. Pat. No. 5,001,036, the disclosure of which is incorporated herein by reference.

Other additives may be present in the photosensitive layer as long as they are compatible with the other ingredients present in the photosensitive layer and they do not alter the adhesion balance between the essentially non-photosensitive, non-tacky organic layer and the second strippable substrate. Such additives include stabilizers, antihalation agents, optical brightening agents, release agents, surfactants coating aids and plasticizers. A thermal polymerization inhibitor may also be present to increase storage stability of the photosensitive element. Some useful additives are disclosed in U.S. Pat. No. 5,001,036, the disclosure of which is incorporated herein by reference.

In general, the photosensitive layer should have a coating weight in the range of 5–50 mg/dm², preferably 20 to 35 mg/dm².

PHOTORELEASE LAYER

The photorelease layer may optionally be present between the second strippable substrate and the photosensitive layer. It comprises a solid oxyethylene homopolymer photorelease agent of the formula, $H(COH_2CH_2)_nOH$, with a molecular weight greater than about 3000. Suitable photorelease layers are disclosed in Assignee's U.S. Pat. Nos. 5,028,511 and 5,001,036, the disclosure of which is incorporated herein by reference.

The homopolymer may be used in combination with UV stabilizers, anti-oxidants, etc. Some useful UV stabilizers include benzotriazoles and benzophenones. Some useful anti-oxidants include hindered phenols such as tetrakis [methylene 3-(3,5-di-t-butyl-4-hydroxyphenyl)propionate] methane, and 1,3,5-trimethyl-2,4,6-tris(3,5-di-t-butyl-4-hydroxybenzyl)benzene.

The polymer may be mixed with the optional ingredients and dissolved in an appropriate solvent. The photorelease layer may have a coating weight of 10 to 100 mg/dm², preferably 30 to 80 mg/dm², more preferably 55 mg/dm². The coating weight of the photorelease layer should be high enough to insure structural integrity, but low enough to avoid distortion of the image through a three-dimensional effect.

PROCESS OF MANUFACTURE

The element of the invention is prepared by applying, preferably coating, the polymeric isolation layer and the essentially non-photosensitive, non-tacky organic layer onto a first strippable substrate. Any method and apparatus known to one skilled in the art may be used in applying these layers. For example, the first strippable substrate may be coated with the polymeric isolation layer and the essentially non-photosensitive, non-tacky organic layer by roller coating, spray coating, gravure coating, slot coating, or extrusion coating, preferably extrusion coating. The polymer and essentially non-photosensitive, non-tacky organic layers may be applied one at a time with the first applied layer being dried before application of the second layer or the layers may be coated simultaneously.

Preferably, the photosensitive layer is coated on the second strippable substrate and then laminated to the previously prepared element having an essentially non-photosensitive, non-tacky organic layer, isolation polymer layer and first substrate with the essentially non-photosensitive, non-tacky organic layer adjacent the photosensitive layer. Alternately, the photosensitive layer may be coated on the dried surface of the essentially non-photosensitive, non-tacky organic layer and the second strippable substrate may be laminated to it. It is important that the second strippable substrate have greater adhesion to the photosensitive layer than the first strippable substrate to the isolation layer.

PROCESS OF USE

The invention also includes a process for forming a prepress proof comprising, in order:

(I) providing a photosensitive element comprising in order:
  (a) a first strippable substrate S1;
  (b) a substantially transparent, non-photosensitive, polymeric isolation layer having a coating weight of 10 to 150 mg/dm$^2$, preferably 30 to 100 mg/dm$^2$, more preferably 45 to 60 mg/dm$^2$;
  (c) an essentially non-photosensitive, non-tacky organic layer comprising a polymer selected from the group consisting of:
    (i) structured, preferably block, or random polymers prepared from at least one aromatic monomer and at least one monomer selected from the group consisting of butadiene, olefins such as ethylene, propylene, etc., butylene, isobutylene, butene, isoprene, 1,4-hexadiene, acrylonitrile and vinyl acetal; and
    (ii) reaction products of random polymers prepared from at least one aromatic monomer and at least one monomer selected from the group consisting of an olefin such as ethylene, propylene, etc., and butylene with 2-butenedioic acid or cyclic anhydrides such as succinic anhydride and maleic anhydride;
  (d) a photosensitive, optionally pigmented, preferably photopolymerizable layer, and
  (e) a second strippable substrate S2 adjacent the photosensitive layer, wherein the photosensitive layer exhibits improved adhesion to the second strippable substrate upon imagewise exposure to actinic radiation;
(II) peeling off the first substrate and laminating the polymeric isolation layer of the photosensitive element to a permanent support;
(III) imagewise exposing the photosensitive element to actinic radiation through a color separation to form imaged and non-imaged areas; and
(IV) developing the exposed photosensitive element by removing, preferably peeling off, the second strippable substrate S2 along with the exposed areas of the photosensitive layer to form a colored right reading image on the permanent support.

To form a four color proof, steps (I)–(IV) are repeated using a different pigmented photosensitive element and the corresponding color separation, and laminating the different pigmented photosensitive element to the previously formed colored image(s) on the receptor formed in step (IV) to yield a four color proof on the receptor. Preferably, the pigmented photosensitive layer is photopolymerizable.

The four color proof may then be laminated with a top coat element similar to that described in U.S. Pat. No. 5,437,959 issued Aug. 1, 1995 or U.S. Pat. No. 4,921,776 issued May 1, 1990, the disclosures of which are incorporated herein by reference. The top coat element may comprise one or two non-photosensitive layers on a substrate. The preferred process utilizes a photosensitive element in sheet form (versus roll) and a sheet laminator to produce the multicolor proofs.

EXAMPLES

The following examples illustrate the invention wherein parts and percentages are by weight.

Example 1

A 12% solids solution of Kraton® G-1692 thermoplastic elastomer in toluene was made. A 35.0% solids solution of polyvinylacetate (Union Carbide, 83,000 MW) was made in a 0.10/90 w/w acetone/toluene solution for the isolation layer. Films were cast from solution onto 92 gauge silicone Mylar® forming a double layer film with the isolation layer directly in contact with the silicone Mylar®. The resulting dry films possessed a coating weight of 80 mg/sq dm and 50 mg/sq dm for the Kraton® G-1692 and isolation layers, respectively. The resulting structure was then roll laminated at room temperature to a 25 mg/sq dm magenta photopolymer (magenta PP)/200ED film structure. The resulting composite film structure was 92 silicone Mylar®/isolation layer/Kraton® G-1692/magenta PP/200 ED Mylar®.

The photopolymer layer was coated from a 26.4% solids by weight solution using 30/70 w/w methanol/toluene coating solvent. The photopolymer dry ingredients consisted in parts by weight of:

| INGREDIENTS | WEIGHT (g) |
|---|---|
| PRO-823, manufactured by Sartomer Company, Exton, PA | 39.09 |
| Fluorad® FC-430, 3M Co., Minneapolis, MN | 0.10 |
| Elvacite® 2051, ICI Acrylics, St. Louis, MO | 21.44 |
| Magenta Chips, manufactured by Quaker Color, Quakertown, PA | 22.98 |
| Scarlet Chips manufactured by Quaker Color, Quakertown, PA | 6.74 |
| o-Cl HABI | 3.06 |
| Calcofluor White, manufactured BASF Corp., Parsippany, NJ | 2.02 |
| Uvitex® OB, manufactured by Ciba Geigy Corp., Hawthorne, NY | 2.02 |
| 2-mercaptobenzoxazole | 1.76 |
| PolyOx® WSRN-3000, manufactured by Union Carbide Chemicals and Plastics Co., Inc. | 0.77 |
| TOTAL SOLIDS | 100 |

After removing the 92 silicone Mylar®, the composite structure was hot roll laminated to Cromalin® CR/1 receptor at 110° C. roll temperature using 600 mm/min lamination speed and 450 lbs/nip pressure. The films were imaged to achieve 3 steps under a UGRA target using a Douthitt exposure unit, manufactured by Douthitt Corp., Detroit, Mich. The 200ED Mylar® cover sheet was peeled leaving a positive working surprint image possessing a 3–97% tonal range.

Peel force measurements were conducted by blanket exposing 1 inch wide strips of composite film structure laminated on CR/1 through the 200ED Mylar® side. Kraton® G -1692 was compared with Stereon® 709 SBR in the essentially non-photosensitive, non-tacky organic layer. The peel force required to remove the 200ED Mylar® cover sheet was recorded:

|   | Structure | n | Average Peel Force (g/in) | Std. Deviation (g/in) |
|---|-----------|---|---------------------------|------------------------|
| 1 | Kraton® G-1692 (single layer) composite | 4 | 116.8 | 2.3 |
| 2 | Kraton® G-1692 (4 composite layers) | 4 | 145.2 | 5.1 |
| 3 | Stereon 709 SBR (single layer) composite | 4 | 208.0 | 3.8 |

Composite layer = organic layer plus isolation layer

In comparing structure 1 to Structure 3 (control), a 75% decrease in peel force is observed with the inventive Structure 1. With Structure 2 (which comprises 4 composite layers) the peel force is also significantly reduced from the peel force exhibited by the control, thereby showing the integrity of that structure.

It is further noted that if an organic polymer such as Kraton® D-1107 were combined to form a composite layer in place of Kraton® G-1692 in Structure 1 or 2, peel forces well in excess of 208 g/in would be observed. In fact, the peel force sometimes is not measurable because the sample often is destroyed. As such, the inventive structure would be expected to exhibit approximately a 300% decrease in peel force compared to a structure employing Kraton® D-1107.

What is claimed is:

1. An element comprising, in order:
   (a) a first strippable substrate;
   (b) a substantially transparent, non-photosensitive, polymeric isolation layer having a coating weight of 10 to 100 mg/dm$^2$;
   (c) an essentially non-photosensitive, non-tacky organic layer having a coating weight of 25 to 200 mg/dm$^2$ and comprising of at least one polymer selected from:
      (i) structured, block or random polymers prepared from at least one aromatic monomer and at least one monomer selected from olefin such as ethylene, propylene, butylene, isobutylene, butene, 1,4-hexadiene, and vinyl acetal; and
      (ii) reaction products of random polymers prepared from at least one aromatic monomer and at least one monomer selected from ethylene, propylene, and butylene with 2-butenedioic acid or cyclic anhydrides, wherein the organic layer is soluble in a solvent containing at least 90% toluene;
   (d) a pigmented photosensitive layer; and
   (e) a second strippable substrate adjacent the photosensitive layer; wherein the photosensitive layer exhibits increased adhesion to the second strippable substrate during removal of the first strippable substrate.

2. The element of claim 1 wherein the photosensitive layer is a photopolymerizable layer.

3. The element of claim 1 wherein the photosensitive layer has a coating weight of 5 to 50 mg/dm$^2$.

4. The element of claim 1 wherein the first and second strippable substrates are selected from the group consisting of silicone-treated, electrically discharged, corona-treated, electron beam treated and plasma-treated films selected from the group consisting of polyester, matte finished polyester, polyethylene and polypropylene.

5. The element of claim 4 wherein the first strippable substrate is a silicone-release-treated polyester film.

6. The element of claim 4 wherein the second strippable substrate is an electrically discharge-treated polyester film.

7. The element of claim 1 wherein the non-photosensitive, polymeric isolation layer has a coating weight of 45 to 60 mg/dm$^2$.

8. The element of claim 1 wherein the non-photosensitive, polymeric isolation layer comprises a vinyl polymer.

9. The element of claim 1 wherein the non-photosensitive, polymeric isolation layer comprises an acrylate-type thermoplastic polymer.

10. The element of claim 1 wherein the essentially non-photosensitive, non-tacky organic layer has a coating weight of 70 to 90 mg/dm$^2$.

11. The element of claim 1 wherein the aromatic monomer is selected from the group consisting of styrene and substituted styrene.

12. The element of claim 1 wherein the photosensitive element is in sheet form.

* * * * *

UNITED STATES PATENT AND TRADEMARK OFFICE
CERTIFICATE OF CORRECTION

PATENT NO. : 5,965,321
DATED : Oct. 12, 1999
INVENTOR(S) : Taylor, Jr. et al.

It is certified that error appears in the above-identified patent and that said Letters Patent is hereby corrected as shown below:

On the cover page change "Assignee: E.U. du Pont de Nemours and Company"
to --Assignee: E.I. du Pont de Nemours and Company--

Signed and Sealed this

Eighteenth Day of April, 2000

Attest:

Q. TODD DICKINSON

*Attesting Officer*     *Director of Patents and Trademarks*